United States Patent
Hashimoto

(10) Patent No.: US 6,378,091 B1
(45) Date of Patent: Apr. 23, 2002

(54) TEST MODE CIRCUIT CAPABLE OF SURELY RESETTING TEST MODE SIGNALS

(75) Inventor: Hiroaki Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/336,591

(22) Filed: Jun. 21, 1999

(30) Foreign Application Priority Data

Jun. 26, 1998 (JP) ............................. 10-180334

(51) Int. Cl.$^7$ ...................... G01R 31/28; G11C 29/00
(52) U.S. Cl. ................... 714/724; 714/718; 714/733
(58) Field of Search ..................... 714/724, 718, 714/733

(56) References Cited

U.S. PATENT DOCUMENTS

| | | | | |
|---|---|---|---|---|
| 5,184,327 A | * | 2/1993 | Matsuda et al. | 365/201 |
| 5,204,837 A | * | 4/1993 | Suwa et al. | 365/201 |
| 5,337,282 A | * | 8/1994 | Koike | 365/222 |
| 5,365,481 A | * | 11/1994 | Sawada | 365/201 |
| 5,619,462 A | * | 4/1997 | McClure | 365/201 |
| 5,652,730 A | * | 7/1997 | Kono et al. | 365/226 |
| 5,687,345 A | * | 11/1997 | Matsubara et al. | 711/103 |
| 5,793,687 A | * | 8/1998 | Deans et al. | 365/201 |
| 5,844,914 A | * | 12/1998 | Kim et al. | 714/718 |
| 5,966,388 A | * | 10/1999 | Wright et al. | 714/719 |
| 6,014,336 A | * | 1/2000 | Powell et al. | 365/201 |
| 6,028,798 A | * | 2/2000 | Roohparvar | 365/201 |
| 6,175,529 B1 | * | 1/2001 | Otsuka et al. | 365/201 |

FOREIGN PATENT DOCUMENTS

| | | |
|---|---|---|
| JP | 03-194799 | 8/1991 |
| JP | 5-233099 | 9/1993 |
| JP | 5-266695 | 10/1993 |
| JP | 5-274898 | 10/1993 |
| JP | 7-134661 | 5/1995 |
| JP | 8-185331 | 7/1996 |

* cited by examiner

Primary Examiner—David Ton
Assistant Examiner—Joseph D. Torres
(74) Attorney, Agent, or Firm—Sughrue Mion, PLLC

(57) ABSTRACT

In a test mode circuit, a latch circuit latches a test enable signal and address signals, and a decoder circuit decodes the address signals latched in the latch circuit in response to the test enable signal latched in the latch circuit to generate one of the test mode signals. A data mask terminal is connected to an input circuit for inputting a signal at the data mask terminal and generating a mask signal. A gate circuit is connected to the latch circuit or the decoder circuit and the input circuit. The gate circuit passes the test enable signal and the address signals or the test mode signals when the mask signal is inactive, and masks the same signals when the mask signal is active.

4 Claims, 3 Drawing Sheets

TEST MODE CIRCUIT CAPABLE OF SURELY RESETTING TEST MODE SIGNALS

BACKGROUND OF THE INVENTION

1. Field of the Invention

The present invention relates to a test mode circuit incorporated into a semiconductor memory device such as synchronous dynamic random access memory (SDRAM) device.

2. Description of the Related Art

In a test mode circuit incorporated into a SDRAM device, a latch circuit latches a test enable signal and address signals, and a decoder circuit decodes the address signals latched in the latch circuit in response to the test enable signal latched in the latch circuit to generate one of test mode signals. Also, a power on reset signal generating circuit is provided. A gate circuit controlled by the power on reset signal generating circuit is connected between the latch circuit and the decoder circuit. Therefore, when the power on reset signal is generated from the power on reset signal generating circuit, the gate circuit stops the transfer of the test enable signal and the address signals from the latch circuit to the decoder circuit, thus resetting the test mode signals. This will be explained later in detail.

In the above-described prior art test mode circuit, whether or not the power on reset signal is generated depends on the rising waveform of the power supply voltage. Therefore, even if the power is turned ON, the power on reset signal generating circuit does not surely generate a power-on-reset signal. As a result, even after the power is turned ON, the device may enter a normal operation mode without resetting the test mode signals. In this case, the normal operation mode becomes erroneous. In addition, since it is impossible for the user to reset the test modes from the exterior of the device, the device can never enter a normal operation mode.

SUMMARY OF THE INVENTION

It is an object of the present invention to provide a test mode circuit capable of surely resetting test mode signals.

According to the present invention, in a test mode circuit, a latch circuit latches a test enable signal and address signals, and a decoder circuit decodes the address signals latched in the latch circuit in response to the test enable signal latched in the latch circuit to generate one of the test mode signals. A data mask terminal is connected to an input circuit for inputting a signal at the data mask terminal and generating a mask signal. A gate circuit is connected to the latch circuit or the decoder circuit and the input circuit. The gate circuit passes the test enable signal and the address signals or the test mode signals when the mask signal is inactive, and masks the same signals when the mask signal is active.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art test mode circuit will be explained with reference to FIG. 1. The prior art test mode circuit is incorporated into an SDRAM device, for example.

Figure 1:
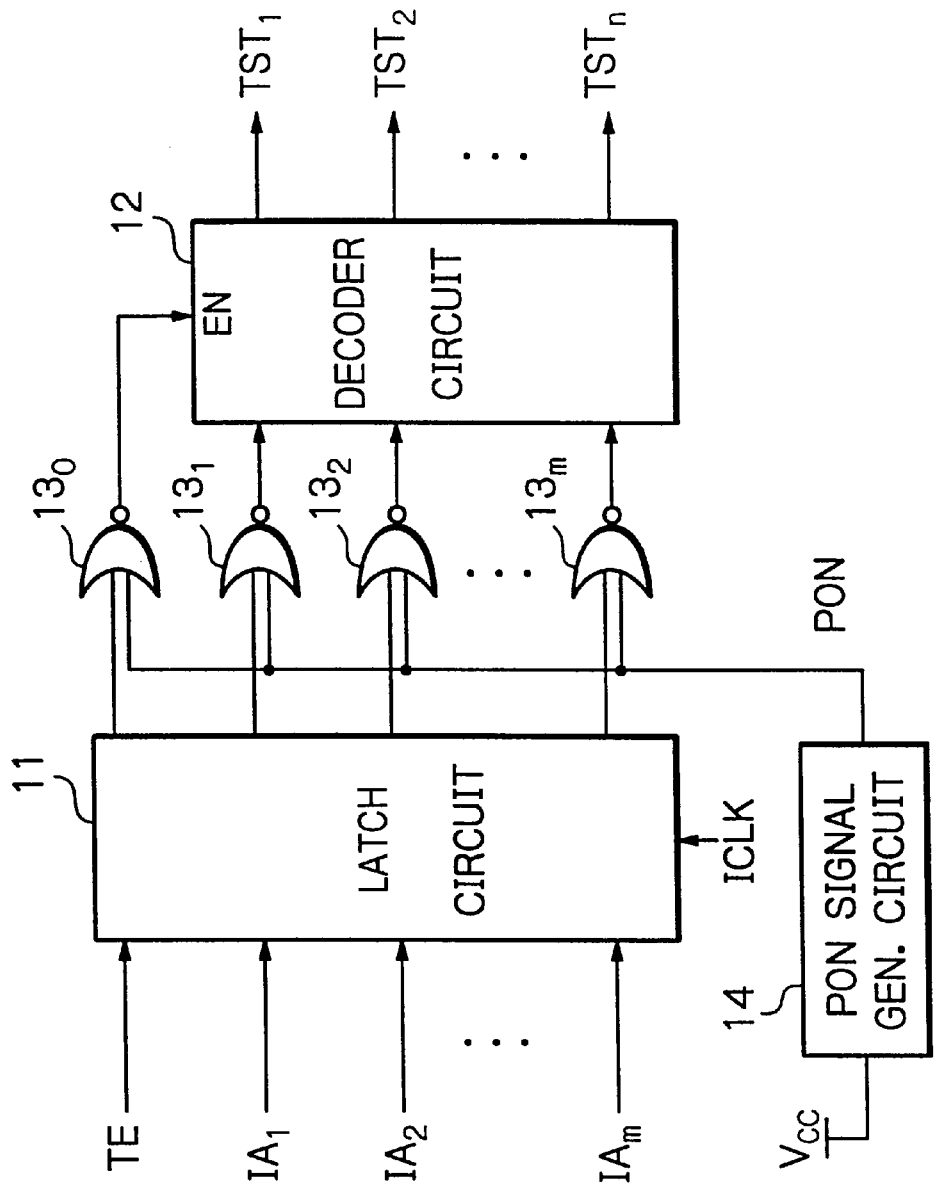
FIG. 1 is a block circuit diagram illustrating a prior art test mode circuit.

In FIG. 1, a test mode circuit is constructed by a latch circuit 11 for latching a test enable signal TE for enabling a test mode entry and internal address signals $IA_1, IA_2, \ldots, IA_n$ in response to an internal clock signal ICLK, and a decoder circuit 12 for decoding the internal address signals latched in the latch circuit 11 to generate test mode signals $TST_1, TST_2, \ldots, TST_n$ in response to the test enable signal TE latched in the latch circuit 11. That is, when one of the test mode signals $TST_1, TST_2, \ldots, TST_n$ is generated, the device enters a predetermined test mode which is different from a normal operation mode.

Note that the internal clock signal ICLK is generated by a latch circuit (not shown) for latching an external clock signal CLK (not shown).

Also, interposed between the latch circuit 11 and the decoder circuit 12 are NOR circuits $13_0, 13_1, 13_2, \ldots, 13_n$ for transmitting the internal address signals from the latch circuit 11 to the decoder circuit 12. The NOR circuits $13_0, 13_1, 13_2, \ldots, 13_n$ are controlled by a power on reset (PON) signal generating circuit 14. That is, when the power is turned ON to increase a power supply voltage $V_{cc}$, the power on reset signal generating circuit 14 generates a power on reset signal PON having a predetermined time duration. As a result, the power on reset signal PON makes all the output signals of the NOR circuits $13_0, 13_1, 13_2, \ldots, 13_n$ low (=GND), thus resetting all the test mode signals $TST_1, TST_2, \ldots, TST_n$. Thereafter, the device enters a normal operation mode. Note that, if at least one of the test mode signals $TST_1, TST_2, \ldots, TST_n$ is not reset, the normal operation mode may become erroneous.

In the test mode circuit of FIG. 1, whether or not the power on reset signal PON is generated depends on the rising waveform of the power supply voltage $V_{cc}$. Therefore, even if the power is turned ON, the power on reset signal generating circuit 14 does not surely generate a power-on-reset signal PON. As a result, even after the power is turned ON, the device may enter a normal operation mode without resetting the test mode signals. In this case, however, the, normal operation mode becomes erroneous. In addition, since it is impossible for the user to reset the test modes from the exterior of the device, the device can never enter a normal operation mode.

Figure 2:
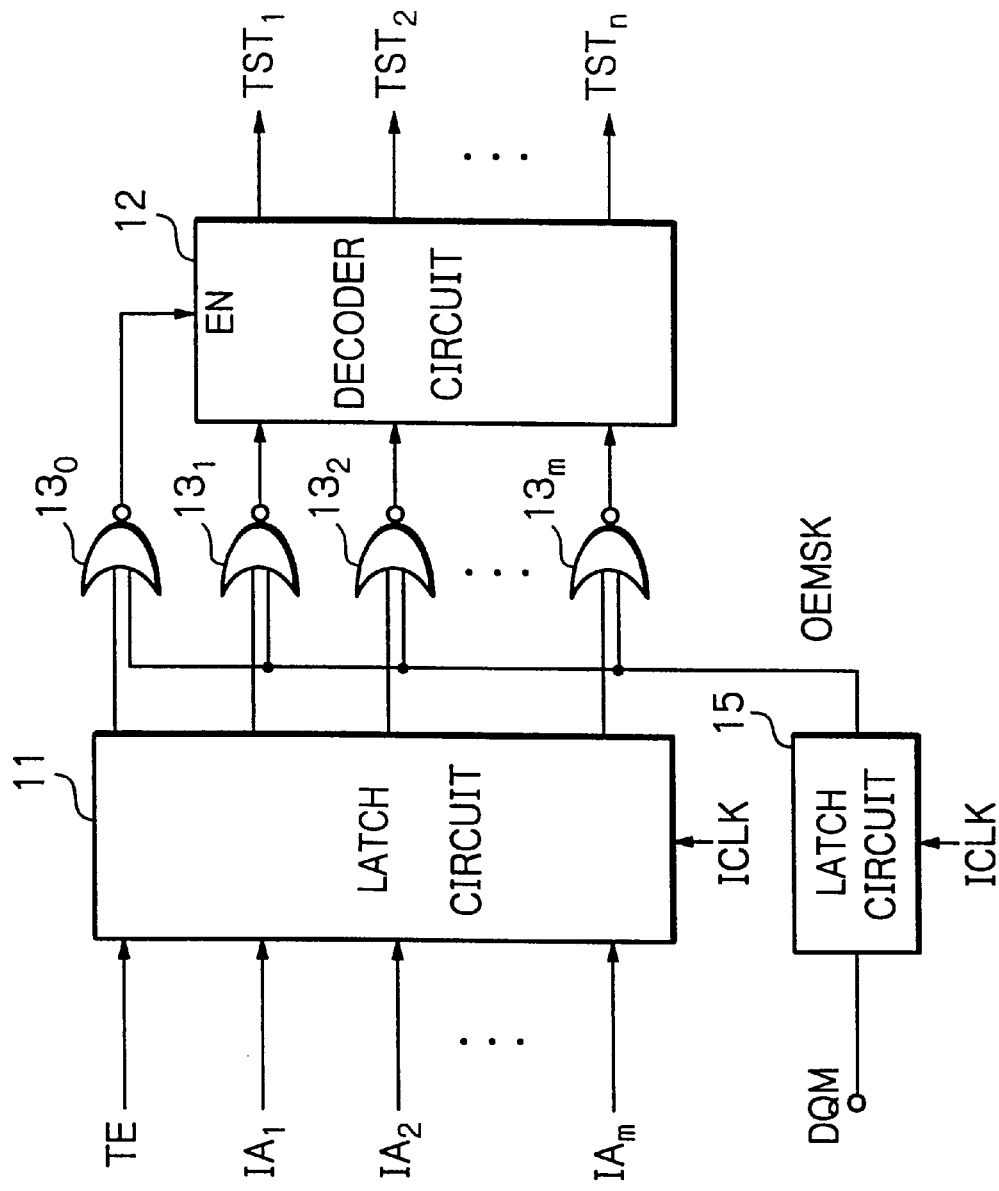
FIG. 2 is a block circuit diagram illustrating a first embodiment of the test mode circuit according to the present invention.

In FIG. 2, which illustrates a first embodiment of the present invention, a latch circuit 15 is provided instead of the power on reset signal generating circuit 14 of FIG. 1. The latch circuit 15 latches a signal at a data mask terminal DQM in response to the internal clock signal ICLK to generate an output enable mask signal OEMSK which is supplied to the NOR circuits $13_0, 13_1, 13_2, \ldots, 13_m$.

The operation of the test mode circuit of FIG. 2 is explained next. In this case, the data mask terminal DQM is connected to a central processing unit (CPU) (not shown).

In a normal operation mode, the CPU makes the signal at the data mask terminal DQM high (=$V_{cc}$) in a power on sequence. As a result, all the output signals of the NOR circuits $13_0, 13_1, 13_2, 13_m$ are made low, so that the decoder circuit 12 surely resets all the test mode signals $TST_1, TST_2, \ldots, TST_n$. Thereafter, the device can enter a normal operation mode.

On the other hand, in a test entry mode, the CPU makes the signal at the data mask terminal DQM low (=GND). As a result, the decoder circuit 12 decodes the internal address signals $IA_1, IA_2, \ldots, IA_m$ latched in the latch circuit 11 in response to the test enable signal TE latched in the latch circuit 11, so that the decoder circuit 12, generates one of the test mode signals $TST_1, TST_2, \ldots, TST_n$ in accordance with the internal address signals $IA_1, IA_2, \ldots, IA_m$, thus entering a predetermined test mode.

Figure 3:
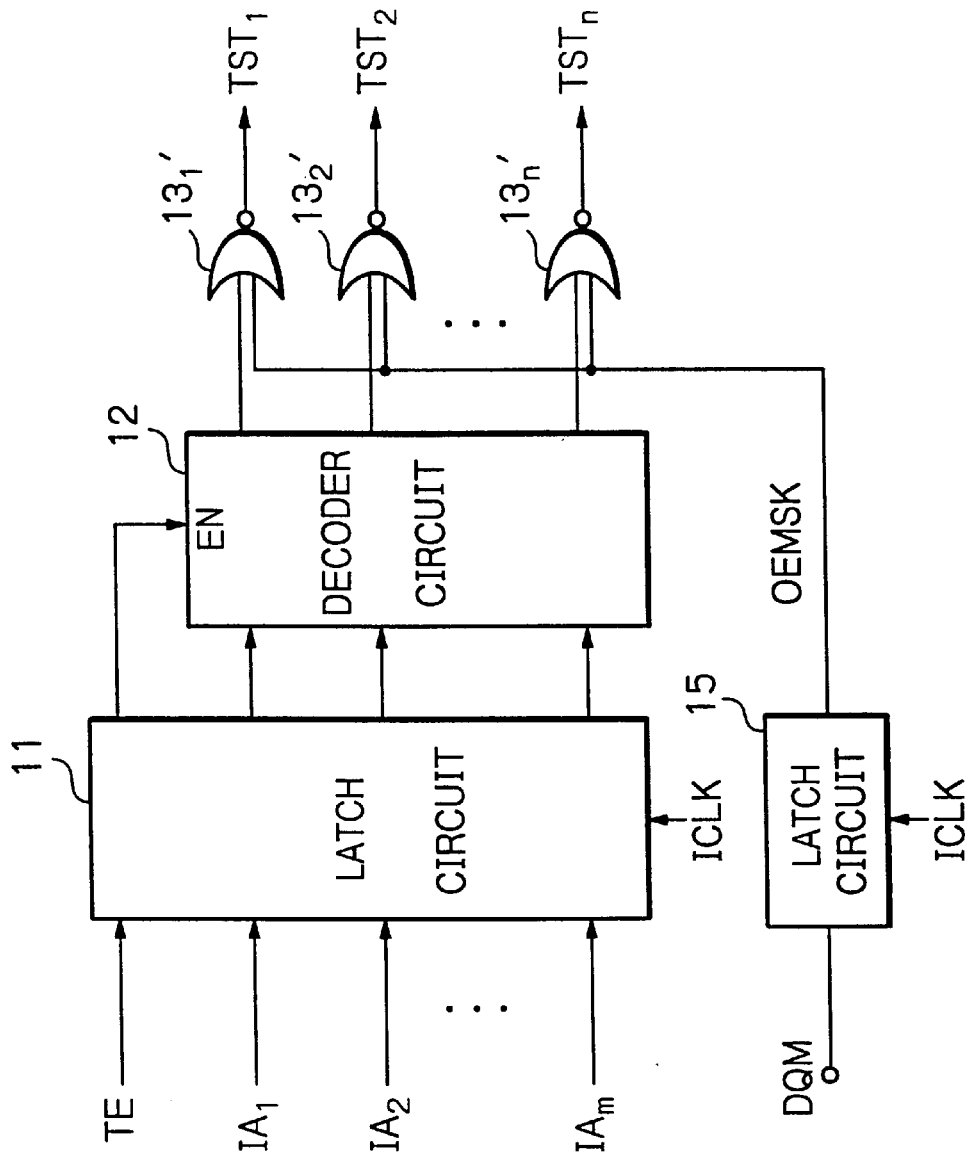
FIG. 3 is a block circuit diagram illustrating a second embodiment of the test mode circuit according to the present invention.

In FIG. 3, which illustrates a second embodiment of the present invention, NOR circuits $13_1', 13_2', \ldots, 13_n'$ are provided instead of the NOR circuits $13_1, 13_2, \ldots, 13_m$ of FIG. 2. The NOR circuit $13_1', 13_2', \ldots, 13_n'$ are connected to the post stage of the decoder circuit 12 and are controlled by the output enable mask signal OEMSK of the latch circuit 15.

The operation of the test mode circuit of FIG. 3 is explained next. Also, in this case, the data mask terminal DQM is connected to a central processing unit (CPU) (not shown).

In a normal operation mode, the CPU makes the signal at the data mask terminal DQM high(=$V_{cc}$) in a power on sequence. As a result, in spite of the operation of the decoder circuit 12, all the output signals of the NOR circuits $13_1', 13_2', \ldots, 13_n'$ are made low, so that all the test mode signals $TST_1, TST_2, \ldots, TST_n$ are surely reset. Thereafter, the device can enter a normal operation mode.

On the other hand, in a test entry mode, the CPU makes the signal at the data mask terminal DQM low (=GND). As a result, the NOR circuits $13_1', 13_2', \ldots, 13_n'$ are in a through state. Therefore, when the decoder circuit 12 decodes the internal address signals $IA_1, IA_2, \ldots, IA_n$ latched in the latch circuit 11 in response to the test enable signal TE latched in the latch circuit 11, the decoder circuit 12 generates one of the test mode signals $TST_1, TST_2, \ldots, TST_n$ in accordance with the internal address signals $IA_1, IA_2, \ldots, IA_m$. Thus, the one of the test mode signals $TST_1, TST_2, \ldots, TST_n$ is substantially generated through the NOR circuits $13_1', 13_2', \ldots, 13_n'$ thus entering a predetermined test mode.

In the above-mentioned embodiments, although the latch circuit 15 is operated in response to the internal clock signal, the latch circuit 15 can be of a non-synchronization type.

As explained hereinabove, according to the present invention, the test mode state of a device can be surely reset by incorporating a test mode circuit according to the present invention, which stabilizes the operation of the device and improves the reliability of the device.

What is claimed is:

1. A test mode circuit comprising:

a first latch circuit for latching a test enable signal and address signals in response to an internal clock;

a data mask terminal;

a second latch circuit, connected to said data mask terminal, for latching a signal at said data mask terminal in response to said internal clock signal to generate a mask signal;

a gate circuit, connected to said first and second latch circuits, for passing said test enable signal and said address signals latched in said first latch circuit when said mask signal is at a first level, and masking said test enable signal and said address signals latched in said latch circuit to generate low logic outputs when said mask signal is at a second level; and a decoder circuit, connected to said gate circuit, for decoding said address signals passed through said gate circuit in response to said test enable signal passed through said gate circuit to generate one of test mode signals, said decoder circuit resetting said test mode signals when said gate circuit generates said low logic output signals.

2. The test mode circuit as set forth in claim 1, wherein said gate circuit comprises:

a first NOR circuit for receiving said test enable signal latched in said first latch circuit and said mask signal; and a plurality of second NOR circuits each for receiving one of said address signals latched in said first latch circuit and said mask signal, said mask signal being low and high logic signals, when said mask signal is at said first and second levels, respectively.

3. A test mode circuit comprising:

a first latch circuit for latching a test enable signal and address signals in response to an internal clock signal;

a decoder circuit, connected to said first latch circuit, for decoding said address signals latched in said first latch circuit in response to said test enable signal latched in said first latch circuit to generate one of test mode signals;

a data mask terminal;

a second latch circuit, connected to said data mask terminal, for latching a signal at said data mask terminal in response to said internal clock signal to generate a mask signal; and a gate circuit, connected to said decoder circuit and said second latch circuit, for passing said test mode signals when said mask signal is at a first level, and masking said test mode signals to generate low logic outputs when said mask signal is at a second level.

4. The test mode circuit as set forth in claim 3, wherein said gate circuit comprises a plurality of NOR circuits each for receiving one of said test mode signals and said mask signal, said mask signal being low and high logic signals, when said mask signal is at said first and second levels, respectively.

* * * * *

UNITED STATES PATENT AND TRADEMARK OFFICE
CERTIFICATE OF CORRECTION

PATENT NO. : 6,378,091 B1
DATED : April 23, 2002
INVENTOR(S) : Hiroaki Hashimoto It is certified that error appears in the above-identified patent and that said Letters Patent is hereby corrected as shown below:

Column 2,
Line 11, delete "$IA_N$" insert -- $IA_m$ --;
Line 23, delete "$13_N$" insert -- $13_m$ --;
Line 26, delete "$13_N$" insert -- $13_m$ --;
Line 32, delete "$13_N$" insert -- $13_m$ --;
Line 64, delete "$13_2$" insert -- ..., --

Column 3,
Line 33, delete "$IA_N$" insert -- $IA_m$ --

Signed and Sealed this

Twentieth Day of August, 2002

*Attest:*

*Attesting Officer*

JAMES E. ROGAN
*Director of the United States Patent and Trademark Office*